United States Patent [19]

Attwood et al.

[11] 4,314,206

[45] Feb. 2, 1982

[54] NOISE CHOPPER FOR PREVENTING FALSE LOCKS IN A COHERENT CARRIER RECOVERY SYSTEM

[75] Inventors: Stanley W. Attwood; James H. Stilwell, both of Scottsdale, Ariz.

[73] Assignee: Motorola Inc., Schaumburg, Ill.

[21] Appl. No.: 106,566

[22] Filed: Dec. 26, 1979

[51] Int. Cl.³ .............................................. H03D 3/18
[52] U.S. Cl. ...................................... 329/50; 329/104; 329/124; 331/12; 375/86
[58] Field of Search ............... 329/50, 122, 123, 124, 329/104; 455/208, 209, 214, 260, 265; 331/11, 12, 18, 25; 375/86, 120

[56] References Cited

U.S. PATENT DOCUMENTS

| | | | |
|---|---|---|---|
| 4,017,798 | 4/1977 | Gordy et al. | 375/120 X |
| 4,085,378 | 4/1978 | Ryan et al. | 331/12 X |
| 4,157,514 | 6/1979 | Naito et al. | 331/12 X |
| 4,167,027 | 9/1979 | Hashimoto | 329/122 X |

Primary Examiner—Siegfried H. Grimm
Assistant Examiner—Edward P. Westin
Attorney, Agent, or Firm—Eugene A. Parsons

[57] ABSTRACT

A multiple phase shift keyed data coherent carrier recovery system wherein a coherent carrier tracking loop has attached thereto a signal generator for providing a signal with non-stationary zero-crossing times (e.g. a noise generator), which signal generator chops, or alters the phase of, signals within the loop to prevent the loop from locking on harmonics or subharmonics and to allow AC coupling with DC response therein.

6 Claims, 1 Drawing Figure

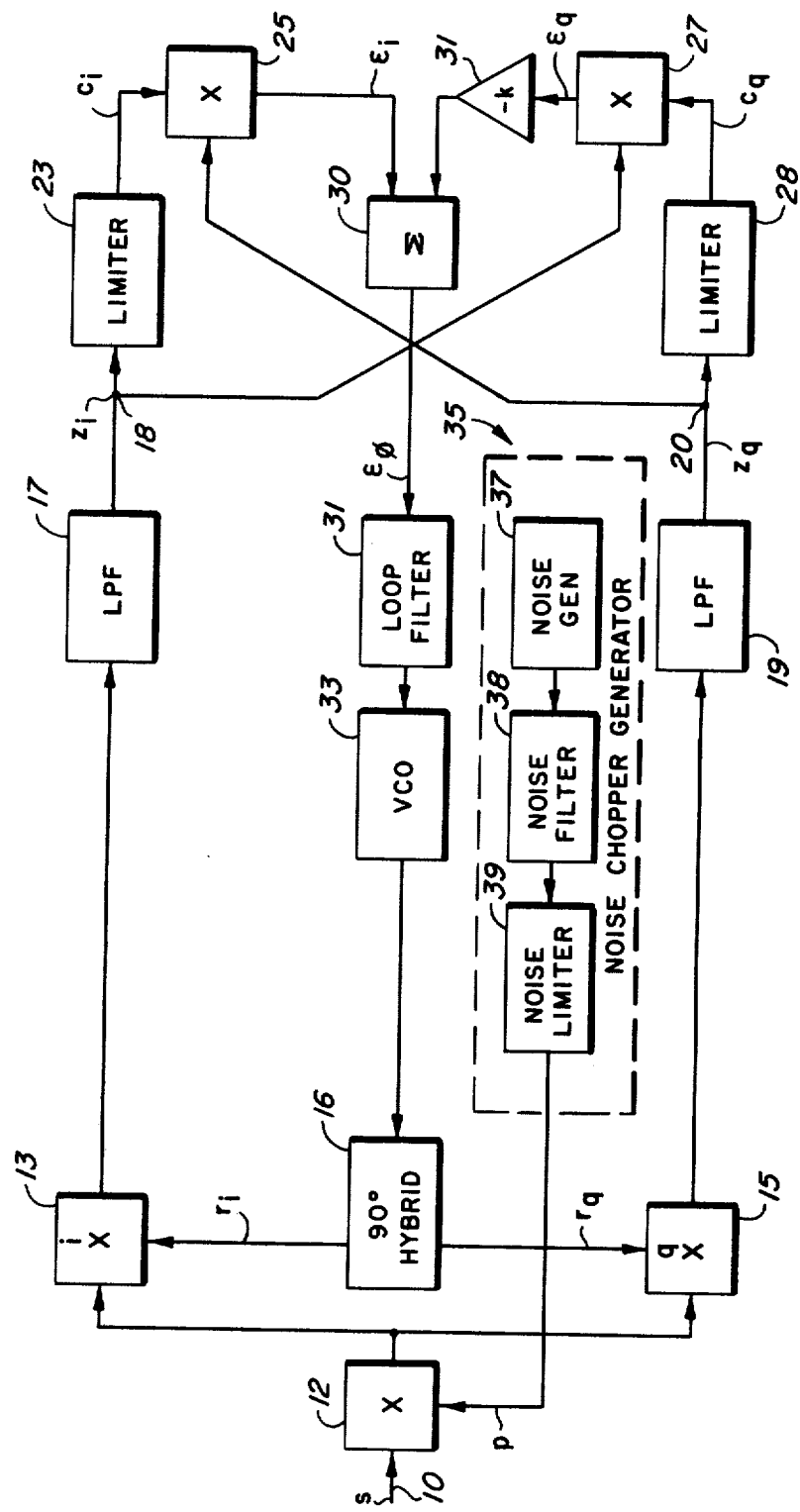

NOISE CHOPPER FOR PREVENTING FALSE LOCKS IN A COHERENT CARRIER RECOVERY SYSTEM

BACKGROUND OF THE INVENTION

Demodulators or coherent carrier trackers, particularly for phase shift keyed signals, have two basic problems during acquisition; one theoretical, one practical.

When acquiring a modulated signal in a demodulator with a control loop bandwidth that is narrow compared to the modulation rate, the loop may very likely synchronize to a subharmonic of the modulation rate above or below the desired carrier frequency synchronization point. This can occur in high gain loops whenever the channel or the demodulator is band limited, i.e., wherever the modulation transitions are no longer instantaneous. Mathematically and physically the subharmonics are generated in the demodulation process of sufficient magnitude for the loop to synchronize to one of them. Using an unmodulated carrier during synchronization is one way of preventing this possibility. This means the control loop must have DC response.

Frequently it is undesirable practically to use DC coupled stages. AC coupling is used with chopper stabilization to generate DC response. The loop now may acquire improperly on the subharmonics of the chopper repetition frequency just as though the signal were modulated. Means exist to sense these improper lock conditions and to sequence to the proper lock state at an increase in acquisition time. However, in many applications this increase in acquisition time is unsatisfactory.

SUMMARY OF THE INVENTION

The present invention pertains to apparatus for use in conjunction with a multiple phase shift keyed data coherent carrier recovery system including a coherent carrier tracking loop, which apparatus is utilized for preventing the loop from locking onto a harmonic or subharmonic and includes a signal generator for providing a signal with non-stationary zero-crossing times and means for connecting the signal generator to the loop for altering the phase of signals therein at aperiodic intervals.

It is an object of the present invention to provide a new and improved multiple phase shift keyed data coherent carrier recovery system.

It is a further object of the present invention to provide a coherent carrier tracking loop in a multiple phase shift keyed data coherent carrier recovery system which allows AC coupling with DC response and prevents improper lock on harmonics or subharmonics.

These and other objects of this invention will become apparent to those skilled in the art upon consideration of the accompanying specification, claims and drawings.

BRIEF DESCRIPTION OF THE DRAWING

The single FIGURE is a block diagram of a noise chopper stabilized carrier tracking loop embodying the present invention.

DESCRIPTION OF THE PREFERRED EMBODIMENTS

Referring specifically to the FIGURE, an input lead 10 adapted to receive phase shift keyed signals thereon (in this specific embodiment bi-phase shift keyed) is connected to one input of a multiplier 12. An output of the multiplier 12 is connected to an input of an in-phase multiplier 13 and an input of a quadrature multiplier 15. A second input of the multiplier 13 is connected to receive an in-phase reference signal from a 90° hybrid circuit 16 and a second input of the multiplier 15 is connected to receive a quadrature or 90° phase shifted reference signal from the hybrid circuit 16. An output of the multiplier 13 is applied through a low pass filter 17 to a junction 18. An output of the multiplier 15 is applied through a low pass filter 19 to a junction 20. The junction 18 is connected through a limiter 23 to one input of an in-phase channel error multiplier 25 and directly to one input of a quadrature channel error multiplier 27. The junction 20 is connected directly to a second input of the multiplier 25 and through a limiter 28 to a second input of the multiplier 27. An output of the multiplier 25 is connected to one input of a summing circuit 30 and an output of the multiplier 27 is connected through an amplifier 31 to a second input of the summing circuit 30. The output of the summing circuit 30 is connected through a loop filter 31 to a control input of a voltage controlled oscillator 33. An output of the oscillator 33 is connected as a reference signal to the hybrid circuit 16. The above described circuitry is a coherent carrier tracking loop and, in this specific embodiment is a quadra-phase shift keyed demodulator for demodulating bi-phase or quadraphase shift keyed signals. The tracking loop may be, for example, the well known Costas demodulator loop or any of a large variety of demodulator tracking loops well known to those skilled in the art.

In this specific embodiment a noise chopper generator, generally designated 35, is provided. The noise chopper generator 35 includes a noise generator 37 having an output connected through a noise filter 38 and a noise limiter 39 to a second input of the multiplier 12. The noise chopper generator 35 provides an aperiodic signal or a signal with non-stationary zero-crossing times. This aperiodic signal when applied to the multiplier 12, serves to chop the incoming signal, or reverse the phase thereof for each zero-crossing of the chopping signal.

In this configuration $$S = D_i \cos(\omega_s t + \theta) + k D_q \sin(\omega_s t + \theta)$$

where:

$D_i$ is the i channel data ($\pm 1$), $D_q$ is the q channel data ($\pm 1$), k is the relative amplitude of the i and q channels, $\omega_s = 2\pi f_s$ and is the signal carrier frequency in radians/second, $\theta$ is the phase of the signal relative to the reference $r_i$, $\phi = (\omega_s - \omega_r)t + \Psi$. $\Psi$ is an arbitrary phase, and p is the noise driven chopper signal and is $\pm 1$ with random zero-crossing time intervals.

$z_i = r_i s p$. When $\omega_r = \omega_s$, then $z_i = p(D_i \cos\phi + k D_q \sin\phi)$ ignoring scale factors and sum frequency terms.

$z_q = p(-D_i \sin\phi + k d_q \cos\phi)$ when proper lock is achieved, $C_i = \text{sgn}(z_i) = pD_i$ when $\phi \doteq 0$.

$C_q = \text{sgn}(z_q) = pD_q$ when $\phi \doteq 0$.

$\epsilon_i = C_i z_q, \epsilon_q = C_q z_i$ $\epsilon_\phi = \epsilon_i - K\epsilon_q$ $$\epsilon_\phi = (1-Kk)\sin\phi + D_i D_q(k-K)\cos\phi$$

The loop control behaves normally.

K normally equals k to eliminate the cross modulation term. For BPSK k=0. k=1 for balanced QPSK. For unbalanced QPSK, k may assume any value.

When $\omega_r \neq \omega_s$ in an unchopped (or fixed chopping rate) system, the mathematical solution is far more complex. Basically the finite rise times give rise to impulse like transients in the error term. Since these normally may occur only at intervals of the data symbol they create harmonic components of the bit rate (or fixed chop rate). When multiplied by the local reference offset from the carrier, $f_s$, by an amount exactly equal to a subharmonic of the symbol rate, a coherent tracking signal is generated. This signal is sufficient to control the VCO and maintain an apparent lock or permanent fixed offset frequency relationship between the carrier and the reference.

The finite rise times are created by the low pass filters required to limit the noise-to-signal ratio at the final error detectors. (It would be the IF bandpass filters in the x2 or x4 type demodulators.)

With noise chopping the apparent transient response is spread over the bandwidth of the noise and coherence vanishes. With no modulation the equivalent can be seen by observing that the zero crossings of the chop signal may appear at any time and hence a coherent offset is not possible.

The noise chopper generator of the present system may be used during acquisition where DC coupling exists and it may then be removed or, because it is nullified in the final signal as shown above, the chopper can be left on essentially continuously without serious effect on the recovered carrier. With AC coupling the chopper generator may be removed after acquisition is accomplished whenever the data rate is high compared to the break frequency of the AC coupling. For data rates approximately equal to the loop bandwidth, the chopping can reduce the data modulation noise under poor signal-to-noise ratios.

The key in the performance of the present system is the non-stationary zero-crossing times which are not present with fixed chopping rates or fixed modulation rates. The apparatus and method described is only one possible embodiment of this idea. Two other possibilites are PM modulation of a square wave chopper, and FM modulation of a square wave chopper. In at least the last two types of systems the rate and range of modulation are fairly critical. In this embodiment the apparatus is self de-chopping in the sense that this occurs automatically in the in-phase and quadrature channel error multipliers (25 and 27 in the FIGURE to form $\epsilon_i$ and $\epsilon_q$ respectively. The chopper generator 35 can also be applied to one side only (in-phase or quadrature channel) with DC coupling on the other side and removed anywhere up to the loop filters. That is, wherever significant gain is used prior to the loop filter. Also, two code generators may be applied, one in common with both reference signals as described and one connected to only one side (in-phase or quadrature channel) to further reduce the DC sampling requirements and to maintain the benefits of random chopping.

While we have shown and described specific embodiments of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

We claim:

1. In a multiple phase shift keyed data coherent carrier recovery system including a coherent carrier tracking loop, apparatus comprising a signal generator providing a signal with non-stationary zero-crossing times and means for connecting said signal generator to the loop for altering the phase of signals therein and preventing the loop from locking onto a harmonic or subharmonic of the signal generator.

2. Apparatus as claimed in claim 1 wherein the signal generator is a noise generator.

3. Apparatus as claimed in claim 1 wherein the connecting means is a multiplier having an output connected to the input of the recovery system, an input connected to receive the input signal for the system and an input connected to receive the signal from the signal generator.

4. A multiple phase shift keyed data coherent carrier recovery system comprising a coherent carrier tracking loop and a signal generator for providing a signal with non-stationary zero-crossing times with means connecting said signal generator to said loop for chopping signals in said loop.

5. A system as claimed in claim 4 wherein the tracking loop includes a Costas demodulator loop.

6. In a multiple phase shift keyed data coherent carrier recovery system including a coherent carrier tracking loop, a method of preventing the loop from locking into a harmonic or subharmonic of a chopper comprising the steps of aperiodically reversing the phase of signals in the tracking loop.

* * * * *